United States Patent
Tenaglia et al.

(10) Patent No.: US 7,049,047 B2
(45) Date of Patent: May 23, 2006

(54) IMAGEABLE ELEMENT WITH MASKING LAYER COMPRISING SULFATED POLYMER

(75) Inventors: Davide Tenaglia, Broomfield, CO (US); Kevin Barry Ray, Fort Collins, CO (US); Chris McCullough, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/915,674

(22) Filed: Aug. 10, 2004

(65) Prior Publication Data

US 2006/0035166 A1 Feb. 16, 2006

(51) Int. Cl.
*G03F 1/10* (2006.01)
*G03F 7/039* (2006.01)
*G03F 7/095* (2006.01)
*G03F 7/30* (2006.01)

(52) U.S. Cl. .................... 430/273.1; 430/5; 430/270.1; 430/302; 430/306; 430/330; 430/910; 430/964

(58) Field of Classification Search .................... 430/5, 430/273.1, 270.1, 302, 306, 330, 910, 964
See application file for complete search history.

(56) References Cited

U.S. PATENT DOCUMENTS

| | | | |
|---|---|---|---|
| 4,323,637 A | 4/1982 | Chen et al. | |
| 4,427,759 A | 1/1984 | Gruetzmacher et al. | |
| 4,894,315 A | 1/1990 | Feinberg et al. | |
| 5,262,275 A | 11/1993 | Fan | |
| 5,705,310 A | 1/1998 | Van Zoeren | |
| 5,719,009 A | 2/1998 | Fan | |
| 5,912,105 A | 6/1999 | Haberhauer et al. | |
| 6,063,546 A | 5/2000 | Gelbart | |
| 6,238,837 B1 | 5/2001 | Fan | |
| 6,312,872 B1 | 11/2001 | Murphy et al. | |
| 6,367,381 B1 | 4/2002 | Kanga | |
| 6,413,699 B1 | 7/2002 | Kanga | |
| 6,472,121 B1 | 10/2002 | Murphy et al. | |
| 6,521,390 B1 | 2/2003 | Leinbach et al. | |
| 6,558,876 B1 | 5/2003 | Fan | |
| 6,599,679 B1 | 7/2003 | Philipp et al. | |
| 6,605,410 B1 | 8/2003 | Yang et al. | |
| 2001/0053498 A1 | 12/2001 | Fujimoto et al. | |
| 2002/0115019 A1 | 8/2002 | Kaczun et al. | |
| 2002/0197540 A1 | 12/2002 | Goodin et al. | |
| 2003/0129533 A1 | 7/2003 | Goodin et al. | |
| 2005/0008965 A1* | 1/2005 | Tao et al. ................. | 430/270.1 |
| 2005/0129915 A1* | 6/2005 | Tao et al. ................. | 428/195.1 |

FOREIGN PATENT DOCUMENTS

JP 2001-260551 9/2001

OTHER PUBLICATIONS

Kice et al, The Mechanism of the Acid Hydrolysis of Sodium Aryl Sulfates, Journal of the American Chemical Society, vol. 88, Nov. 20, 1966, pp. 5242-5245.
Burstein et al, Kinetics and Mechanism of Solvolysis of Steroid Hydrogen Sulfates, Journal of the American Chemical Society, vol. 80, Oct. 5, 1958, pp. 5235-5239.

* cited by examiner

*Primary Examiner*—Richard L. Schilling
(74) *Attorney, Agent, or Firm*—J. Lanny Tucker

(57) ABSTRACT

Thermally imageable elements comprising a masking layer and a substrate are disclosed. The masking layer contains a sulfated polymer or a mixture of sulfated polymers and absorbs both infrared and ultraviolet radiation. When the masking layer is on the substrate, the imageable element may be imaged and developed to form a photomask. When the imageable element additionally comprises a photosensitive layer, the masking layer may be imaged and developed to form an integral photomask. The imageable elements that comprise a photosensitive layer are useful as flexographic printing plate precursors.

34 Claims, No Drawings

IMAGEABLE ELEMENT WITH MASKING LAYER COMPRISING SULFATED POLYMER

FIELD OF THE INVENTION

The invention relates to imageable elements that comprise a masking layer and a substrate. In particular, it relates to thermally imageable elements in which the masking layer comprises a sulfated polymer.

BACKGROUND OF THE INVENTION

Flexographic printing plates are used in letterpress printing, particularly on surfaces which are soft and easily deformable, such as packaging materials, e.g., cardboard, paper, and plastic packaging films. Flexographic printing plates can be prepared from imageable elements that comprise a photosensitive layer on a substrate. The element is imaged with ultraviolet and/or visible radiation and then developed with a suitable developer leaving a printing relief, which can be used for flexographic printing. If after exposure to radiation the exposed regions of the photosensitive layer are removed in the developing process, the element is referred to as "positive working". Conversely, if the developing process removes the unexposed regions and the exposed regions remain, the element is "negative working". Elements useful as flexographic printing plate precursors are typically negative working, but need not be so.

Imaging of the imageable element with ultraviolet and/or visible radiation is typically carried out through a mask, which has clear and opaque regions. Imaging takes place in the regions of the photosensitive layer under the clear regions of the mask but does not occur in the regions of the photosensitive layer under the opaque regions of the mask. For negative working systems, the mask is usually a photographic negative of the desired image. If corrections are needed in the final image, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of printing plate precursors, which obviates the need for exposure through a mask, is becoming increasingly important in the printing industry. In these processes, a computer controlled laser scans and images the photosensitive layer of the printing plate precursor. However, it has not typically been practical to use lasers to image flexographic printing plate precursors, which have relatively thick photosensitive layers. These elements have low photosensitivity and require long exposure times even with high-powered lasers. In addition, most of the imageable materials used in these elements have their greatest sensitivity in the ultraviolet region of the spectrum. Although ultraviolet emitting lasers are known, economical and reliable ultraviolet lasers with high power are not readily available. However, relatively inexpensive infrared lasers that have a useful power output are readily available.

Flexographic printing plate precursors that comprise a layer that is ablatable by infrared radiation have been used to form an integral mask over the photosensitive layer, thereby providing the advantages of direct digital imaging. The masking layer is imaged with an infrared laser and the resulting element exposed with ultraviolet and/or visible radiation through the mask. However, because ablation produces debris, the filmsetter used to image ablative masks requires additional filtration systems to prevent the debris from contaminating the optics of the filmsetter. In addition, some of the ablatable layers require large amounts of expensive infrared absorbers.

Thus, a need exists for imageable elements useful as flexographic printing plate precursors that provide the advantages of direct digital imaging but do not exhibit some or all of the disadvantages of laser exposure suffered by existing methods.

SUMMARY OF THE INVENTION

In one aspect the invention is an imageable element useful as a printing plate precursor. The imageable element comprises, in order:

(a) a substrate, (b) a photosensitive layer, the photosensitive layer comprising a photosensitive composition, and (c) a masking layer comprising a sulfated polymer and a radiation absorber;

wherein:

the radiation absorber comprises one or more materials selected from the group consisting of materials that absorb ultraviolet radiation, photothermal conversion materials, photothermal conversion materials that also absorb ultraviolet radiation, and mixtures thereof; and the masking layer absorbs ultraviolet radiation and infrared radiation.

The substrate is preferably flexible and, more preferably, transmits visible and/or ultraviolet radiation. The element may additionally comprises a barrier layer between the photosensitive layer and the masking layer.

In another aspect, the invention is a method for forming an image useful as a flexographic printing plate, the method comprising the steps of, in order: thermally imaging and developing the masking layer and forming a photomask; overall exposing the photosensitive layer through the photomask and forming an imaged photosensitive layer comprising imaged and complementary unimaged regions in the photosensitive layer; removing the photomask; and developing the imaged photosensitive layer and forming the image by removing one of the imaged regions and the unimaged regions.

DETAILED DESCRIPTION OF THE INVENTION

Unless the context indicates otherwise, in the specification and claims, the terms sulfated polymer, radiation absorber, photothermal conversion material, material that absorbs ultraviolet radiation, binder, surfactant, coating solvent, and similar terms also include mixtures of such materials. Thermal imaging refers to imaging with a hot body, such as a thermal head, or with infrared radiation. Unless otherwise specified, all percentages are percentages by weight and all temperatures are in ° C.

Imageable Elements

The imageable element comprises, in order, a substrate and a thermally imageable masking layer. The masking layer comprises a sulfated polymer and a radiation absorber. The masking layer may be on the substrate, or there may be one or more layers between the substrate and the masking layer. Typically a photosensitive layer is between the substrate and the thermally imageable masking layer. The photosensitive layer comprises a positive or negative working photosensitive composition, typically a photopolymerizable composition. An optional barrier layer and/or an optional cover sheet may also be present.

Substrate

The substrate comprises a support, which may be any material conventionally used to prepare imageable elements useful as printing plate precursors. The support is preferably strong and stable. It should resist dimensional change under conditions of use so that color records will register in a full-color image. For use in flexographic printing, the substrate is preferably flexible for good contact during printing. Suitable supports include polymeric films such as polyester, polystyrene, polyethylene, polypropylene, polycarbonate, polyamide and fluoropolymers. A preferred support is a polyester film; particularly preferred is polyethylene terephthalate. The support is typically about 0.0051 to 0.025 cm thick, preferably about 0.0076 to 0.020 cm thick. When the imageable element requires a backflash exposure, the substrate must transmit the radiation used for the backflash exposure, typically ultraviolet and/or visible radiation. When the masking layer is on the substrate and the imaged and developed imageable element is to be used as a photomask, the substrate must transmit the radiation to be used to expose through the mask, typically ultraviolet and/or visible radiation. Typically, at least 80%, and preferably 90%, of the radiation is transmitted in each case.

The substrate may also comprise a subbing layer over the surface of the support adjacent to the photosensitive layer and an antihalation layer or layers on either or both surfaces of the support.

Photosensitive Layer

The photosensitive layer, which is over the substrate, comprises a layer of a photosensitive composition. Either a positive working or a negative working photosensitive composition may be used. In particular, numerous negative working photosensitive compositions are known for use in the photosensitive layer of flexographic printing plate precursors. Suitable examples include negative-working, ultraviolet and/or visible sensitive, photopolymerizable compositions such as are known in the art. These compositions typically comprise an elastomeric binder, at least one free-radical polymerizable monomer, and a photoinitiator that is sensitive to ultraviolet and/or visible radiation. Examples of suitable photocompositions have been disclosed, for example, in Chen, U.S. Pat. No. 4,323,637; Gruetzmacher, U.S. Pat. No. 4,427,759; and Feinberg, U.S. Pat. No. 4,894,315.

The elastomeric binder can be a single polymer or mixture of polymers that are soluble, swellable or dispersible in aqueous, semi-aqueous or organic solvent developers. Binders that are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue, U.S. Pat. No. 3,794,494; Proskow, U.S. Pat. No. 4,177,074; Proskow, U.S. Pat. No. 4,431,723; and Worns, U.S. Pat. No. 4,517,279. Elastomeric binders that are soluble, swellable or dispersible in organic solvent developers include natural or synthetic polymers of conjugated diolefin hydrocarbons, including polyisoprene, poly (1,2-butadiene), poly(1,4-butadiene), butadiene/acrylonitrile, polystyrene-polybutadiene-polystyrene thermoplastic-elastomeric block copolymers, polystyrene-polyisoprene-polystyrene thermoplastic-elastomeric block copolymers, and other copolymers. The block copolymers discussed in Chen, U.S. Pat. No. 4,323,636; Heinz, U.S. Pat. No. 4,430,417; and Toda, U.S. Pat. No. 4,045,231 can be used. The binder preferably comprises at least 65% by weight of the photosensitive composition. Core shell microgels and blends of microgels and preformed macromolecular polymers, such as those disclosed in Fryd, U.S. Pat. No. 4,956,252, may also be used.

The photosensitive composition comprises a free-radical polymerizable monomer or mixture of free-radical polymerizable monomers. The monomer or monomers must be compatible with the binder and the other ingredients to the extent that a clear, non-cloudy photosensitive layer is produced. Monomers are well known in the art and include, for example, addition-polymerization ethylenically unsaturated compounds having relatively low molecular weights (generally less than about 30,000). Preferably, the monomers have a relatively low molecular weight, less than about 5000.

Numerous unsaturated monomers, oligomers, and prepolymers polymerizable by free-radical initiated addition polymerization and useful in photosensitive compositions are known in the art. Typical multifunctional monomers are unsaturated esters of alcohols, preferably acrylate and methacrylate esters of polyols, such as, trimethylol propane tri- and tetraacrylate and methacrylate; the tri- and tetraacrylate and methacrylate esters of ethoxylated trimethylolpropane; diethylene glycol diacrylate and dimethacrylate; triethylene glycol diacrylate and dimethacrylate; 1,4-butanediol diacrylate and dimethacrylate; 2,2,4-trimethyl-1,3-pentanediol diacrylate and dimethacrylate; 1,8-octanediol diacrylate and dimethacrylate; 1,10-decanediol diacrylate and dimethacrylate; polyethylene glycol diacrylate and dimethacrylate; glycerol triacrylate and trimethacrylate; ethylene glycol dimethacrylate; pentaerythritol tri- and tetra-acrylate and methacrylate; dipentaerythritol penta- and hexa-acrylate and methacrylate; tripropylene glycol diacrylate and dimethacrylate; the di-(2-acryloxyethyl)ether and the di-(2-methacryloxyethyl)ether of bisphenol A; ethoxylated bisphenol A diacrylate and dimethacrylate; 1,6-hexanediol diacrylate and dimethacrylate; and neo-pentyl glycol diacrylate and dimethacrylate. Monofunctional monomers, which are sometimes used in combination with multifunctional monomers include, for example, tert-butyl acrylate and methacrylate, N,N-diethylaminoethyl acrylate, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, iso-bornyl acrylate and methacrylate, phenyl acrylate and methacrylate, 2-phenylethyl acrylate and methacrylate, and tetrahydrofurfuryl acrylate and methacrylate. Further examples of monomers useful in the photosensitive layer of flexographic printing plate precursors can be found in Chen, U.S. Pat. No. 4,323,636; Fryd, U.S. Pat. No. 4,753,865; Fryd, U.S. Pat. No. 4,726,877; and Feinberg, U.S. Pat. No. 4,894,315. Preferably the monomer constitutes at least 5% by weight of the photosensitive composition.

The photoinitiator can be any single compound or combination of compounds that generate free radicals that initiate the polymerization of the monomer or monomers without excessive termination. The photoinitiator is sensitive to visible or ultraviolet radiation, preferably ultraviolet radiation, and should be insensitive to infrared radiation and preferably is thermally inactive at and below 185° C. Photoinitiators are disclosed in "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525. Suitable photoinitiators have been disclosed in Gruetzmacher, U.S. Pat. No. 4,460,675, and Feinberg, U.S. Pat. No. 4,894,315. Examples of photoinitiators include substituted and unsubstituted polynuclear quinones, benzophenone; benzophenone and 4,4'-bis(dimethylamino)benzophenone; benzophenone and 4,4'-bis(diethylamino)-benzophenone; 2-hydroxy-2-methyl-1-phenylpropan-1-one; 2,4,6-trimethylbenzolyl-diphenylphosphine oxide; 2,2-dimethoxy-2-phenyl-acetophenone (benzildimethyl ketal, BDK); 2-methyl-1-[4-(methylthio)phenyl]-2-morpholinopropanone-1; 1-hydroxycyclohexylphenyl ketone (HCPK); bis(2,6-dimethoxybenzolyl)-2,4,4-trimethyl-pentylphosphine oxide; and combinations thereof. The photoinitiators typically comprise about 0.001 wt % to 10.0 wt % of the weight of the photosensitive composition.

The photosensitive composition may comprise other additives depending on the final properties desired. Such additives include plasticizers, rheology modifiers, thermal polymerization inhibitors, tackifiers, colorants, surfactants, antioxidants, antiozonants, or fillers. Plasticizers are used to adjust the film-forming properties of the elastomer. Plasticizers are well known in the art and include, for example, aliphatic hydrocarbon oils, e.g., naphthenic and paraffinic oils; and liquid polydienes, e.g., liquid polybutadiene and liquid polyisoprene. Resistance of the elements and the flexographic printing plates prepared therefrom to oxygen and ozone attack can be improved by incorporating in the photosensitive composition a suitable amount of compatible antioxidants and/or antiozonants. Antioxidants include, for example, alkylated phenols, e.g., 2,6-di-tert-butyl-4-methyl phenol; alkylated bis-phenols, e.g., 2,2-methylene-bis-(4-methyl-6-tert-butyl phenyl); 1,3,5-trimethyl-2,4,6-tris(3,5-di-tert-butyl-4-hydroxybenzyl) benzene; 2-(4-hydroxy-3,5-tert-butyl anilino)-4,6-bis-(n-octylthio)1,3,5-triazone; polymerized trimethyl dihydroquinone; zinc dibutyl dithiocarbamate and dilaurylthiodipropionate. Antiozonants include, for example, micro crystalline wax and paraffin wax; dibutyl thiourea; 1,1,3,3-tetramethyl-2-thiourea; norbornenes such as di-5-norbornene-2-methyl adipate; and unsaturated vegetable oils. The composition may also comprise one or more dyes for identification or aesthetic purposes, provided they are compatible with the other ingredients, do not strongly absorb the radiation used for photopolymerization, and do not otherwise interfere with photopolymerization.

The mixture of monomer, binder, photoinitiator, and, if any, other ingredients should produce a clear, non-cloudy photosensitive layer, without causing appreciable scattering of the radiation used for overall exposure. The thickness of the photosensitive layer can vary over a wide range depending upon the type of printing plate desired. Thick, soft reliefs are useful for flexographic printing. For so-called "thin plates" the photosensitive layer is about 0.05 to 0.17 cm thick. Thicker plates have a photosensitive layer about 0.25 to 0.64 cm thick, or greater.

Barrier Layer

An essentially oxygen-impermeable barrier layer, which is soluble in the developer and transmits the radiation used for the overall exposure, may be applied over the photosensitive layer. The barrier layer inhibits the migration of oxygen into the photosensitive layer and can also inhibit the migration of materials from the photosensitive layer into the masking layer. Preferred binders for the barrier layer are water-soluble polymers such as polyvinyl alcohol, polyvinyl alcohol/polyvinyl acetate copolymers, polyvinyl pyrrolidone, vinyl pyrrolidone/vinyl acetate copolymers, polyvinyl methyl ether, ring-opened copolymers of maleic anhydride and co-monomers such as methyl vinyl ether, polyacrylic acid, gelatine, cellulose ethers, and mixtures thereof. Most preferred is polyvinyl alcohol.

The barrier layer may comprise other ingredients, such as surfactants. To improve the adhesion of the barrier layer to the photosensitive layer, an adhesion promoter can be added to the barrier layer formulation. One example for such an adhesion promoter is poly(vinyl imidazole) as disclosed in WO 99/06890. The coating weight of the barrier layer typically is about 0.1 to 6 $g/m^2$, and more typically about 0.5 to 4 $g/m^2$.

Masking Layer

The element comprises a masking layer that contains one or more sulfated polymers and a radiation absorber. The masking layer absorbs infrared radiation and the radiation used for overall exposure, typically ultraviolet radiation. The masking layer may also comprise a polymeric binder and other materials that are conventional ingredients of imageable layers, such as surfactants. The masking layer typically has a coating weight of about 1 $g/m^2$ to about 10 $g/m^2$, more typically about 3 $g/m^2$ to about 7 $g/m^2$. The masking layer may be coated onto a substrate, imaged and developed to form a photomask, and laid over the photosensitive layer or, if present, the barrier layer. However, the masking layer is typically formed over the photosensitive layer or, if present, the barrier layer, and, thus, is integral with the other layers of the imageable element. Imaging and development of the masking layer forms an integral photomask.

The masking layer typically comprises about 30 wt % to about 70 wt % of the sulfated polymer; about 0.5 wt % to about 20 wt %, more typically about 1 wt % to about 15 wt %, of the photothermal conversion material; about 1 wt % to about 10 wt %, more typically about 1 wt % to about 5 wt %, of the material that absorbs ultraviolet radiation, and 0 wt % to about 30 wt % of the binder. When carbon black is present, it typically comprises about 15 wt % to about 40 wt % of the masking layer.

Sulfated Polymer

The masking layer comprises a sulfated polymer or a mixture of sulfated polymers. Sulfation refers to the process of introducing sulfate ester groups into a polymer or into a monomer that will be converted to the polymer. Typically, sulfation involves conversion of a hydroxyl group to a sulfate group, such as by methods discussed below. Sulfate group refers to the sulfate ester group, which may be in acid form (—$OSO_3H$) and/or in salt form (—$OSO_3^-X^+$). The terms "sulfated polymer" and "sulfated resin" refer to polymers that contains sulfate groups, typically ones in which the hydroxyl groups for at least some of the repeating units of the polymer have been converted to sulfate groups (sulfate ester groups). Sulfated polymers and their preparation are disclosed in U.S. Pat. No. 6,939,663, and U.S. Publication 2005/0129915, the disclosures of which are incorporated herein by reference.

The sulfate groups may be attached either to aryl groups (i.e., to form sulfated phenolic hydroxyl groups) or to alkyl groups (i.e., to form sulfated aliphatic hydroxyl groups). If the sulfate groups are attached to alkyl groups (for example, aliphatic hydroxyl groups that are converted to sulfate groups), the alkyl groups may be either part of the main chain of the polymer (polymer backbone) or pendent to the main chain of the polymer. If the sulfate groups are attached to aryl groups (for example, phenolic groups are converted to sulfate groups), the aryl groups may be either part of the main chain of the polymer (polymer backbone) or pendent to the main chain of the polymer. The repeating units of the polymer that comprise the sulfate groups may be randomly interspersed among the repeating units of the polymer, or they can be distributed in a more orderly fashion, such as in an alternating copolymer, a segmented copolymer, or a block copolymer. The sulfate groups may be in the acid form (—$OSO_3H$), in the salt form with a positively charged counterion $X^\oplus$ (—$OSO_3^-X^\oplus$), or both.

Degree of sulfation, a measure of the number of repeating units that comprise sulfate groups, is defined as the ratio of the number of sulfate groups in the polymer divided by the total number of hydroxyl groups and sulfate groups in the polymer. For example, a degree of sulfation of 0.25 indicates that 25% of the hydroxyl groups of the polymer are sulfated, that is, 25% of the total number of hydroxyl groups and sulfate groups in the polymer are sulfate groups. Sulfated polymers have a degree of sulfation greater than zero and as high as 1.0. Typically, the degree of sulfation is 0.25 or greater, preferably about 0.3 or greater, and more preferably about 0.5 or greater, that is, at least 50% of the total number of hydroxyl groups and sulfate groups in the polymer are sulfate groups. Sulfated polymers in salt form (i.e., comprising predominantly —$SO_3^-X^\oplus$ groups) may in some cases be more suitable than sulfated polymers in acid form (i.e., comprising predominantly —$OSO_3H$ groups), for use in the imageable elements.

The sulfated polymer may be a sulfated phenolic resin. A phenolic resin is a polymeric material having a structure including hydroxy-substituted aromatic rings (phenolic groups) as part of the polymer backbone, pendent to the polymer backbone, or both. Novolac resins, resol resins, acrylic resins that contain pendent phenol groups, and polyvinyl phenol resins are preferred phenolic resins. Phenolic resins in which the phenolic group is part of the polymer backbone are generally made by a condensation reaction between a substituted or unsubstituted phenol and an aldehyde or ketone. Depending on the preparation route for the condensation reaction, a range of phenolic resins with varying structures and properties can be formed. The type of catalyst and the molar ratio of the reactants used in the preparation of phenolic resins determine the molecular structure, and therefore the physical properties of the resin.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-tert-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions typically in a molar ratio of between about 2:1 and 1:1, phenol to aldehyde or ketone, preferably between about 2:1 to about 5:4. Novolac resins are well known and are described, for example, in Kubo, U.S. Pat. No. 4,308,368; Nishioka, U.S. Pat. No. 4,845,008; Hirai, U.S. Pat. No. 5,437,952; DeBoer, U.S. Pat. No. 5,491,046; Mizutani, U.S. Pat. No. 5,143,816; and Engebrecht, GB 1,546,633.

The sulfated polymer may comprise repeating units represented by structure B and, optionally, repeating units of structure A:

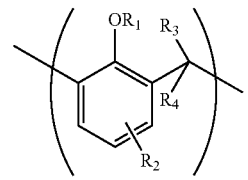

A

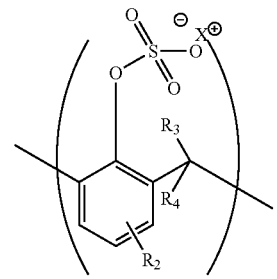

B in which $R_1$, $R_2$, $R_3$, and $R_4$ are each independently hydrogen, alkyl, alkenyl, alkynyl, aryl, alkaryl, or aralkyl, typically hydrogen or methyl; and $X^\oplus$ is a positively charged counterion.

Alternatively, the sulfated polymer may comprise B units, and optionally A, as shown below, in which $R_1$, $R_2$, $R_3$, and $R_4$ are as defined above:

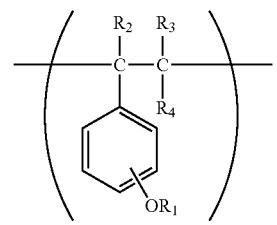

A

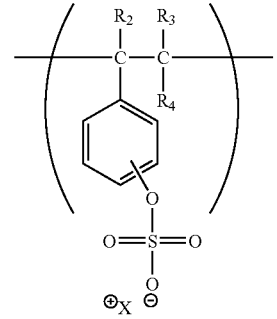

B

Useful counterions ($X^{\oplus}$) include lithium; sodium; potassium; ammonium; substituted ammonium, preferably containing one to twelve carbon atoms, such as methyl ammonium, dimethyl ammonium, trimethyl ammonium, tetramethyl ammonium, ethyl ammonium, diethyl ammonium, triethyl ammonium, tetraethyl ammonium, methyldiethyl ammonium, dimethylethyl ammonium, 2-hydroxyethyl ammonium, di-(2-hydroxyethyl) ammonium, tri-(2-hydroxyethyl) ammonium, 2-hydroxyethyl-dimethyl ammonium; n-propyl ammonium, di-(n-propyl) ammonium, tri-(n-propyl) ammonium, tri-(n-propyl) methyl ammonium and tetra-(n-propyl) ammonium; pyridinium; iodonium; sulfonium; and diazonium.

For these sulfated phenolic resins the degree of sulfation is equal to the ratio of the number of B units (i.e., sulfated phenolic units) to the sum of the number of A units plus B units (i.e., total number of phenolic-type units). The sum of A units and B units may be 50 to 50,000. When the sulfated phenolic resin is derived from, for example, a phenol/formaldehyde novolac resin, $R_1$, $R_2$, $R_3$, and $R_4$ are each hydrogen. When the sulfated polymer is derived from a cresol/formaldehyde novolac resin, $R_1$, $R_3$, and $R_4$ are hydrogen and $R_2$ is methyl. Typically, the degree of sulfation is 0.25 (i.e., 1 B unit to 3 A units) to about 1.0 (i.e., all B units). More typically, the degree of sulfation is greater than about 0.5.

Sulfated polymers may be sulfated or partially sulfated polymers derived from partial or complete sulfation of homopolymers or co-polymers prepared by free radical polymerization of monomers that either contain hydroxyl groups or contain groups, such as acetate, that can be converted to hydroxyl groups after polymerization. Examples of these monomers include:

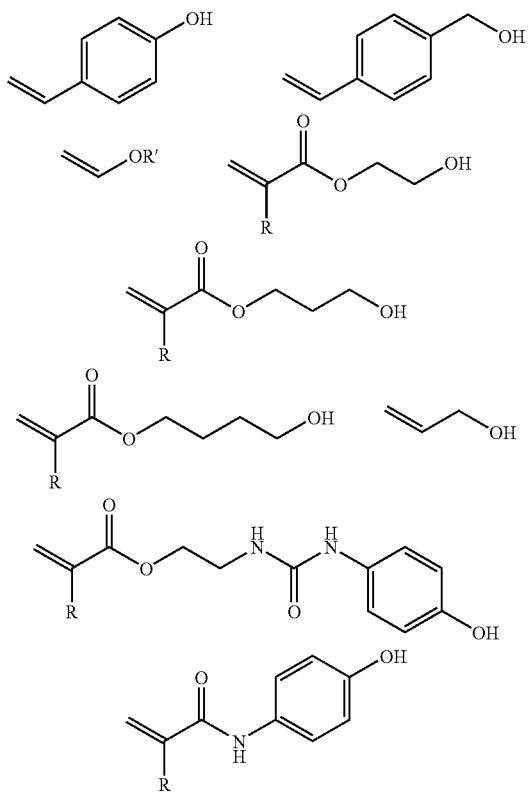

in which R is hydrogen or an alkyl group, typically methyl; and R' is a COR group, i.e., OR' is an ester group, typically acetate.

One or more other polymerizable monomers may be used in the polymerization, provided the resulting sulfated polymer is still operative in the invention. Typical other polymerizable monomers include, for example, acrylic acid; acrylic acid esters such as methyl acrylate, ethyl acrylate, propyl acrylate, and butyl acrylate; methacrylic acid; methacrylic acid esters such as methyl methacrylate, ethyl methacrylate, propyl methacrylate, and butyl methacrylate; methacrylamides and acrylamides, such as methacrylamide, acrylamide, and the acrylamide and methacrylamide of p-aminobenzoic acid; methacrylonitrile; acrylonitrile; maleic acid; maleic anhydride; maleate esters; maleic acid amides; maleic acid imides, such as N-phenylmaleimide, N-cyclohexylmaleimide, and N-benzylmaleimide; itaconic acid; itaconic anhydride; itaconic acid esters; itaconic acid amides; itaconic acid imides, crotonic acid, crotonic anhydride, crotonic acid esters, crotonic acid amides; crotonic acid imides, fumaric acid, fumaric acid esters, fumaric acid amides, alpha, beta-unsaturated lactones, alpha, beta-unsaturated lactams, alpha, beta-unsaturated hydrocarbons; vinyl esters, such as vinyl acetate; alpha, beta-unsaturated ketones, such as methyl vinyl ketone; and styrene and substituted styrenes.

When a vinyl ester, such as vinyl acetate, is used, the ester groups in the resulting polymer or copolymer may be converted to hydroxyl groups by hydrolysis. The resulting hydroxyl groups will be attached to the main chain of the polymer rather than to pendent groups. Preferably, when the polymer is a co-polymer, prior to sulfation at least 30 mol % of the co-polymer's recurring units comprise a hydroxyl group that may be converted to a sulfate group or a group. In the sulfated polymer, a total of preferably at least 30 mol % of the recurring units of the polymer comprise either a hydroxyl group or a sulfate group.

The precursor polymers can be prepared by methods, such as free radical polymerization, which are well known to those skilled in the art and which are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobisisobutyronitrile (AIBN). Suitable solvents include liquids that are inert to the reactants and which will not otherwise adversely affect the reaction. Typical solvents include, for example, water; esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof. Methods for sulfating organic compounds are described, for example, in Jacobson, U.S. Pat. No. 6,448,435, and in *Sulfation and Sulfation Processes*, N. C. Foster (The Chemithon Corporation, 1997). Methods for sulfating hydroxyl-containing polymers are described in Schweiger, U.S. Pat. No. 4,177,345; Tyler, U.S. Pat. No. 4,318,815; and Myers, U.S. Pat. No. 5,750,656.

The sulfated polymer may be prepared by, for example, reaction of a hydroxyl-containing polymer resin with a sulfating agent in an organic solvent to convert hydroxyl groups to sulfate groups. Typical sulfating agents include, for example, sulfur trioxide ($SO_3$); chlorosulfonic acid ($ClSO_3H$); sulfamic acid ($H_2NSO_3H$); the sulfur trioxide-pyridine complex; sulfur trioxide trialkylamine complexes, such as the sulfur trioxide-trimethylamine complex and the sulfur trioxide-triethylamine complex; sulfur trioxide/triarylamine complexes; and the sulfur trioxide/N,N-dimethylformamide complex. In the reaction of a sulfating agent with a polymer to yield a sulfated polymer, the reaction may be controlled so that fewer than all the hydroxy groups of the polymer are sulfated. One particularly useful way of controlling the number of hydroxy groups that are replaced is to limit the amount of sulfating agent used in the reaction.

Other conventional methods may be suitable for preparing the sulfated polymer. For example, a sulfated polymer may be prepared by homopolymerization or by copolymerization using a sulfated monomer, for example by the methods described above, or by sulfating a polymer that comprises protecting groups at some sites normally occupied by hydroxy groups.

Typically, the sulfated polymer is water-soluble to a significant degree. For example, typically about 1 g of a water-soluble sulfated polymer may be dissolved in about 100 ml of water or less at room temperature. Preferably, at least about 3 to about 15 g or more of a sulfated polymer may be dissolved in 100 ml water at room temperature.

An aqueous solution of a sulfated polymer should be maintained at a neutral to basic pH. If the pH of an aqueous solution of a sulfated polymer is less than 5, especially less than 4, the sulfated polymer is not stable in solution and may decompose or form a precipitate. The pH of the solution may be adjusted by conventional means, including adding a suitable quantity of acid, base, or buffer.

A variety of sulfated polymers may be used. In addition to the sulfated polymers discussed above, the sulfated polymer may be, for example:

1) a sulfated co-polymer of methyl methacrylate, acrylonitrile, methacrylamide, and $CH_2=C(CH_3)-CO_2-(CH_2)_2-NH-CO-NH-p-C_6H_4-OH$;

2) a sulfated co-polymer of acrylonitrile, methacrylamide, N-phenylmaleimide, $CH_2=C(CH_3)-CO-NH-p-C_6H_4-CO_2H$, and $CH_2=C(CH_3)-CO_2-(CH_2)_2-NH-CO-NH-p-C_6H_4-OH$;

3) a sulfated co-polymer of butyl methacrylate, styrene, hydroxyethyl methacrylate, and methacrylic acid; or 4) a mixture thereof.

Representative useful sulfated polymers include, for example, the sulfated polymers discussed above, and the sulfated polymers disclosed in U.S. Pat. No. 6,939,663, and U.S. Publication 2005/0129915, the disclosures of which are incorporated herein by reference. Specific examples of these polymers include:

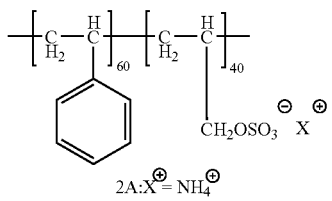

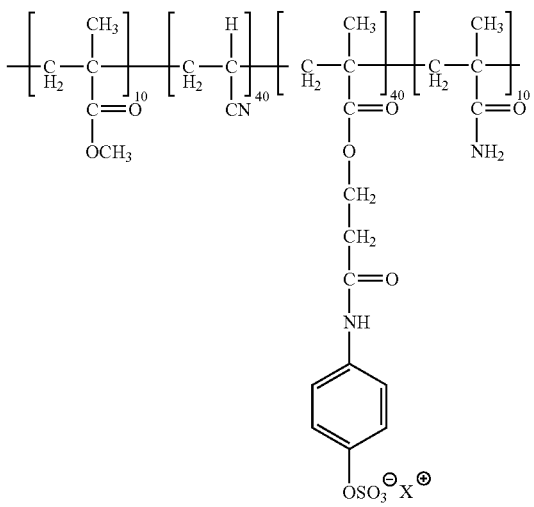

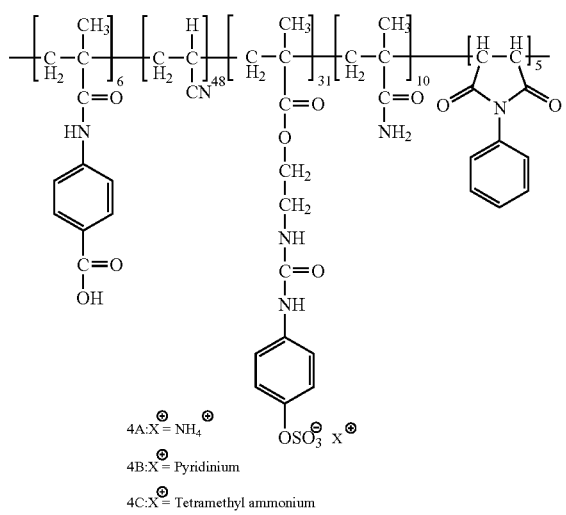

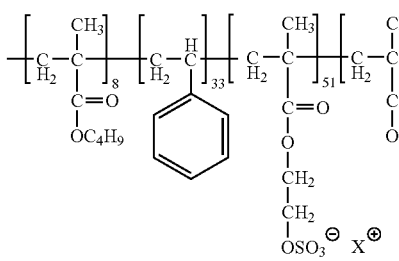

-continued

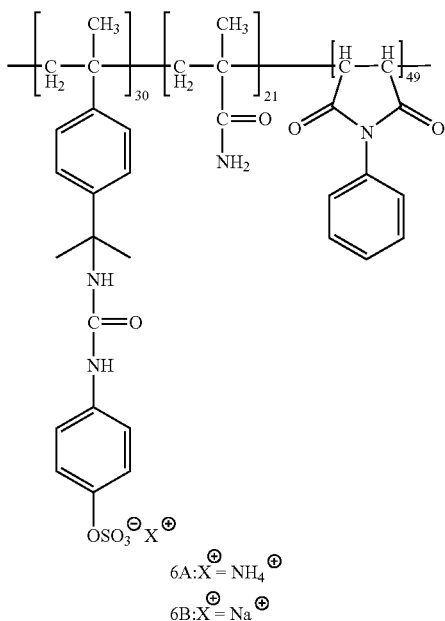

6A: X = NH₄⁺
6B: X = Na⁺

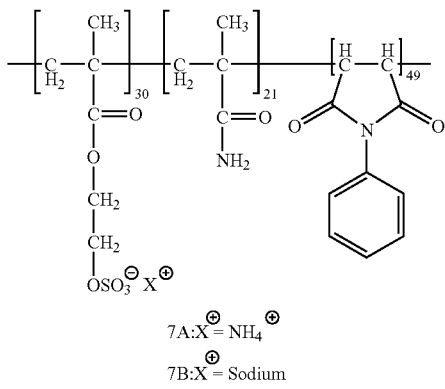

7A: X = NH₄⁺
7B: X = Sodium

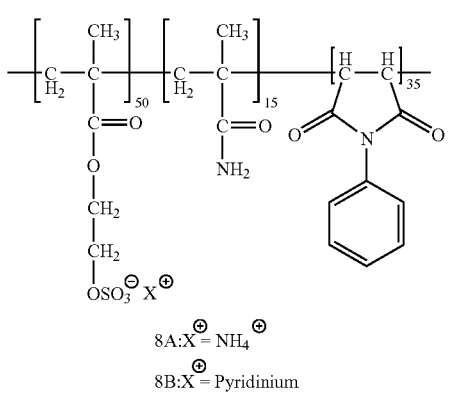

8A: X = NH₄⁺
8B: X = Pyridinium

-continued

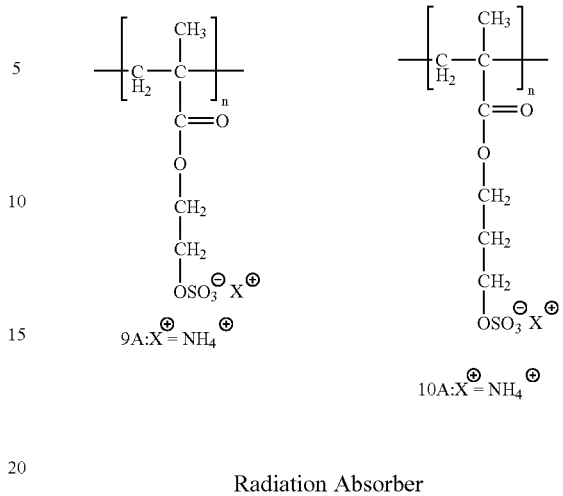

9A: X = NH₄⁺

10A: X = NH₄⁺

Radiation Absorber

The masking layer absorbs ultraviolet radiation and infrared radiation and comprises a radiation absorber. The radiation absorber is a material that absorbs both infrared and ultraviolet radiation and/or a mixture of materials that together absorb both infrared and ultraviolet radiation. The radiation absorber may be a single material that absorbs both ultraviolet radiation and infrared radiation, or it may be mixture of two or more materials that absorb ultraviolet radiation, absorb infrared radiation, and/or absorb both ultraviolet and infrared radiation. Provided the materials are compatible with the other ingredients of the masking layer and do not adversely affect the operation of the imageable element, any combination of these materials may be used, as long as the masking layer absorbs the amount of both infrared radiation and ultraviolet radiation needed for operation of the masking layer. Although when the masking layer is to be imaged with a hot body, it is not necessary for the masking layer to absorb infrared radiation, masking layers that absorb infrared radiation may also be imaged with a hot body, such as a thermal head or an array of thermal heads.

Photothermal conversion materials are infrared-absorbing materials that have a strong absorption in the region of the infrared imaging radiation, between 750 nm to 2,000 nm, typically from about 800 nm to 1200 nm. The material that absorbs ultraviolet radiation and the photothermal conversion material may be different materials, or they may be the same material. Carbon black, for example, is a particularly useful absorber because of its low cost and because of its wide absorption bands that absorb ultraviolet, visible, and infrared radiation. It can function as both an ultraviolet absorber and a photothermal conversion material. It can be used by itself or with one or more materials that absorb ultraviolet radiation and/or one or more photothermal conversion materials. The carbon black may form an ionically stabilized carbon dispersion comprising carbon that is functionalized with ionic groups, preferably quaternary ammonium, sulfonate or carboxylate groups. Examples of such ionically stabilized carbon black dispersions include CAB-O-JET® 200, CAB-O-JET® 300, and CAB-O-JET® IJX-144 (Cabot). Or the carbon black form a polymer-grafted dispersion comprising carbon that is covalently bound to polymeric chains. Examples of such polymer-grafted dispersions include FX-GEW-42 and FX-GE-003 (Nippon Shokubai). Or the carbon black may form a dispersion comprising carbon and a dispersant in water. Examples of such dispersions include GA BLACK 12031 and GA BLACK 12032 (Mikuni Color). A mixture of two or more carbon blacks may be used. The size of the carbon black particles should not be more than the thickness of the layer that contains the carbon black. Preferably, the size of the particles will be half the thickness of the layer or less. When present, carbon black typically about 15 wt % to about 40 wt % of the masking layer.

Other materials that absorb ultraviolet radiation may be used in place of or in addition to carbon black. Materials that absorb ultraviolet radiation include, for example, p-aminobenzoic acid (PABA); 2,2',4,4'-tetrahydroxybenzophenone (benzophenone-1); 2-hydroxy-4-methoxybenzophenone (benzophenone-3); 2,4-dihydroxybenzophenone (benzophenone-2); 2-hydroxy-4-methoxybenzophenone-5-sulfonic acid (benzophenone-4); 2,2'-dihydroxy-4,4'-dimethoxybenzophenone (benzophenone-6); 2,2'-dihydroxy-4-methoxy-benzophenone (benzophenone-8), 2-hydroxy-4-n-octoxy benzophenone (benzophenone-12); methoxycinnamate; ethyl dihydroxypropyl-PABA; glyceryl PABA; homosalate (homomenthyl salicylate); meradimate (menthyl anthranilate); octocrylene (2-ethylhexyl-2-cyano-3,3-diphenylacrylate); octyl dimethyl PABA; octinoxate (octyl methoxycinnamate); octisalate (octyl salicylate); avobenzone (4-t-butyl-4'-methoxy-dibenzoylmethane); ensulizone (2-phenylbenzimidazole-5-sulphonic acid); trolamine salicylate (triethanolamine salicylate); 3-(4-methylbenzylidene)-camphor; red petrolatum; and mixtures thereof. When present, the ultraviolet absorber comprises about 1 wt % to about 10 wt % of the masking layer. Preferably, the $D_{max}$ of the masking layer in the wavelength region used for overall exposure, typically the ultraviolet, is greater than 3, and more preferably greater than 4.

Other materials that absorb infrared radiation (photothermal conversion materials) may be used in place of or in addition to carbon black. The photothermal conversion material may be a dye with the appropriate absorption spectrum. Dyes, especially dyes with a high extinction coefficient in the range of 750 nm to 1200 nm, may be used. Examples of suitable dyes include dyes of the following classes: methine, polymethine, cyanine, arylmethine, hemicyanine, streptocyanine, squarylium, pyrylium, oxonol, naphthoquinone, anthraquinone, porphyrin, azo, croconium, triarylamine, indolium, oxazolium, indocyanine, indotricarbocyanine, oxatricarbocyanine, phthalocyanine, thiocyanine, thiatricarbocyanine, merocyanine, cryptocyanine, naphthalocyanine, thiazolium, polyaniline, polythiophene, chalcogenopyryloarylidene and bis(chalcogenopyrylo)polymethine, polypyrrole, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), as well as the compound whose structure is shown immediately below.

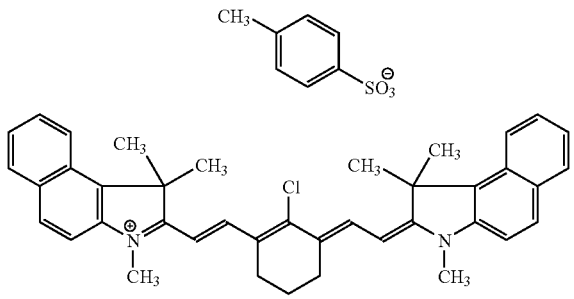

When the imaged masking layer is to be developed with an aqueous developer, infrared absorbing compounds that are soluble in water are preferred. For example, water-soluble N-alkyl sulfate infrared absorbing cyanine compounds of Structure I may be used in the masking layer.

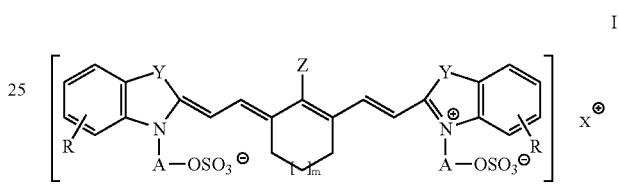

in which:

R is hydrogen, or R is one or more alkyl, substituted or unsubstituted aralkyl, alkoxy, carboxyl, nitro, cyano, trifluoromethyl, acyl, alkyl sulfonyl, aryl sulfonyl, or halogen groups, or R is the atoms necessary to form a substituted or unsubstituted benzo group;

A is $(CH_2)_n$; where n is 1–5; preferably 2–4;

Y is O, S, NR', or $C(R')_2$, where R' is hydrogen or alkyl; preferably methyl;

Z is hydrogen, halogen, alkyl, substituted or unsubstituted aralkyl; substituted or unsubstituted aroxyl, substituted or unsubstituted thioaroxyl, or substituted or unsubstituted diphenylamino;

m is zero or one; and

X is a cation, preferably sodium, potassium, lithium, ammonium, or substituted ammonium.

Y is preferably S or $C(CH_3)_2$.

The preparation of these infrared absorbing compounds is described in U.S. Publication 2005/0130059. The triethyl ammonium salts, for example, may be prepared by the following procedure:

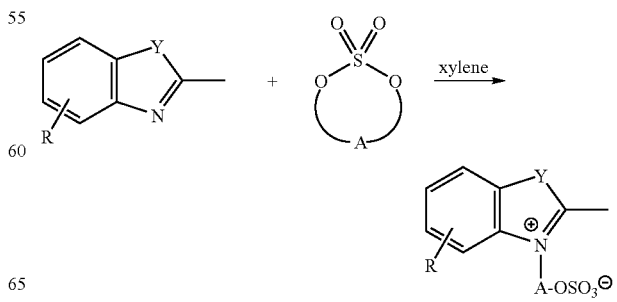

-continued

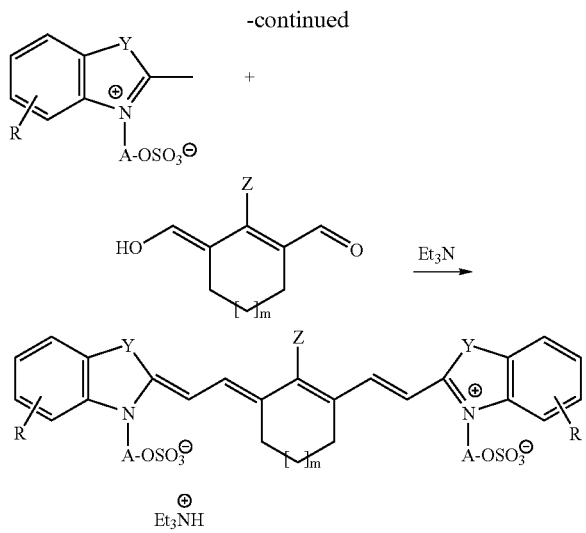

The amount of photothermal conversion material is generally chosen to provide an optical density of at least 0.05, and preferably, an optical density of about 0.5 to at least about 2 to 4 in the masking layer at the imaging wavelength. As is well known to those skilled in the art, the amount of compound required to produce a particular optical density can be determined from the thickness of the layer in which it is present and the extinction coefficient of the photothermal conversion material at the wavelength used for imaging using Beer's law.

Other Ingredients

The masking layer may comprise a water-soluble polymeric binder, such as, polyvinyl pyrrolidone, polyvinyl alcohol, polyacrylamide, polyacrylic acid, polyvinylimidazole, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose, and carboxymethylcellulose. Binders that are not water-soluble, such as polyvinyl pyrrolidone/vinyl acetate copolymers and polyvinyl pyrrolidone/vinyl caprolactam copolymers, may also be suitable.

When the masking layer comprises a binder, the binder comprises not more than about 30% by weight of the thermally sensitive composition, preferably not more than about 20%, more preferably not more than about 10%, and most preferably not more than about 5%, by weight of the masking layer.

Other ingredients that are conventional components of thermally sensitive compositions, such as surfactants, may also be present.

Coversheet

The imageable element may also comprise a temporary coversheet over the masking layer. The coversheet protects the masking layer during storage and handling. Examples of suitable materials for the coversheet include thin films of polystyrene, polyethylene, polypropylene, polycarbonate, fluoropolymers, polyamide or polyester, which can be subbed with release layers, to aid in removal prior to imaging.

Preparation of the Imageable Elements

When the imageable element comprises a photosensitive layer, the imageable elements may be prepared by first applying a layer of photosensitive composition over a surface of the substrate using conventional extrusion, coating, or lamination methods. Typically the ingredients are dispersed or dissolved in a suitable coating solvent, and the resulting mixture coated by conventional methods, such as spin coating, bar coating, gravure coating, roller coating, dip coating, air knife coating, hopper coating, blade coating, slot coating, and spray coating. The term "coating solvent" includes mixtures of solvents.

A variety of conventional organic solvents, for example, alcohols such as methyl alcohol, ethyl alcohol, n- and i-propyl alcohols, n- and i-butyl alcohols and diacetone alcohol; ketones such as acetone, methyl ethyl ketone, methyl propyl ketone, diethyl ketone, and cyclohexanone; polyhydric alcohols and derivatives thereof such as ethylene glycol, ethylene glycol monomethyl ether or its acetate, ethylene glycol monoethyl ether or its acetate; ethylene glycol diethyl ether, ethylene glycol monobutyl ether or its acetate, propylene glycol monomethyl ether or its acetate, propylene glycol monoethyl ether or its acetate, propylene glycol monobutyl ether, 3-methyl-3-methoxybutanol; and special solvents such as N,N-dimethylformamide, methyl lactate, and ethyl lactate, can be used as the coating solvent for the photosensitive layer. However, for convenience during the drying process, solvents having a boiling point of between about 40° C. and about 160° C., preferably between about 60° C. and about 130° C., are typically used. The solids content of the coating solution is typically about 2 to about 25 wt %, based on the weight of the solvent. Selection of the coating solvent will also depend on the nature of the ingredients present in the photosensitive composition.

Drying of the precursor is usually carried out using heated air. The air temperature is preferably between about 30° C. and about 200° C., more preferably between about 40° C. and about 120° C. The air temperature may be held constant during the drying process, or may be gradually stepped up.

Alternatively, the ingredients may be fed into an extruder and the photosensitive layer extruded onto the substrate. The extruder performs the function of melting, mixing, deaerating and filtering the photosensitive composition.

The barrier layer, if present, may be applied over the photosensitive layer using conventional coating or lamination techniques, such as are described above. To prevent mixing of the layers during coating, the masking layer is preferably coated from a solvent in which the photosensitive layer is essentially insoluble. Typical coating solvents for the masking layer are water and aqueous solvents that contain small amounts of organic solvents such as methanol, ethanol, or i-propyl alcohol.

The masking layer may be applied over the barrier layer, if present, or the photosensitive layer if the barrier layer is not present, using conventional coating or lamination techniques, such as are described above. The masking layer is typically dried between about 20° C. to about 150° C. for about 0.5 min to about 5 min.

The masking layer is coated on the barrier layer, if present, or on the photosensitive layer, if the barrier layer is not present. Typically the ingredients of the masking layer are dispersed or dissolved in a suitable coating solvent, such as water or a mixture of water and an organic solvent such as methanol, ethanol, iso-propyl alcohol, and/or acetone, and the resulting mixture coated by conventional methods, such as are described above. After coating, the layer is dried to remove the coating solvent. The resulting element may be air dried at ambient temperature or at an elevated temperature, such as at about 65° C. for about 20 seconds in an oven. Alternatively, the resulting imageable element may be dried by blowing warm air over the element.

When the imageable layer does not comprise the photosensitive layer, the masking layer is coated directly onto the substrate using the procedures described above.

The cover sheet, if present, is typically laminated over the masking layer.

Imaging and Processing

The cover sheet, if present, is removed before imaging, typically by being peeled off. The masking layer is imaged using a hot body such as a thermal head, or an infrared laser.

Imaging of the masking layer may be carried out by well-known methods. The masking layer may be imaged with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the thermally imageable element may be imaged using a hot body, typically with a conventional apparatus containing a thermal printing head. An imaging apparatus suitable for use in conjunction with thermally imageable composition comprises at least one thermal head but would usually include a thermal head array, such as a TDK Model No. LV5416 used in thermal fax machines and sublimation printers or the GS618-400 thermal plotter (Oyo Instruments, Houston, Tex., USA). The operating temperature of the thermal head is typically about 300° C. to 400° C. The typical heating time per pixel may be less than 1.0 ms. A contact pressure about 200 to 500 g/cm$^2$ between the thermal head and the imageable element typically is required for good heat transfer.

Imaging of the masking layer produces a latent image of imaged and unimaged regions in the masking layer. The imaged regions are less soluble in water or aqueous solutions that the unimaged regions, that is, when thermally imaged, the masking layer is negative working. Without being bound by any particular theory or explanation, it is believed that thermal imaging splits the sulfate ester groups from the sulfated polymer, producing regions having reduced solubility in water or aqueous solutions.

Developing of the masking layer may be carried out with an aqueous developer, but in many cases water alone may be used. Typical developing equipment known in the art, such as the Aurora Aquascrubber 34 (Northeast Equipment Services., Westfield, Mass., USA), may be used. Development removes the unimaged regions of the masking layer, preferably reducing their optical density in the wavelength region used for the overall exposure to less than 0.1.

Following imaging and developing of the masking layer, the element is subjected to floodwise (overall or blanket) exposure with ultraviolet and/or visible radiation to which the photosensitive layer is sensitive. The radiation is effectively blocked by the imaged regions of the masking layer, but is at least partly transmitted by regions of the masking layer that were not imaged and, thus, were substantially removed during development. The radiation used for blanket exposure is typically in the range of 250 nm to 500 nm. Radiation sources are well known to those skilled in the art, and include, for example, carbon arcs, mercury-vapor lamps, fluorescent lamps, electron flash units, electron beam units and photographic flood lamps. The most suitable sources of ultraviolet radiation are mercury-vapor lamps, particularly sun lamps. One typical radiation source is the SYLVANIA® 350 Blacklight fluorescent lamp (FR 48T12/350 VL/VHO/180, 115 w), which has a central wavelength of emission around 354 nm.

Overall exposure forms a latent image in the photosensitive layer. In the case of a negative-working photosensitive layer, the latent image is made up of polymerized regions, which correspond to the unimaged regions of the masking layer, and unpolymerized regions, which correspond to the imaged regions of the masking layer. The exposure level depends on the thickness of the photosensitive layer, its sensitivity to the radiation used for overall exposure, and the amount of radiation transmitted by the unimaged regions of the masking layer. However, the level of exposure is usually at least 0.1 mJ/cm$^2$.

When the photosensitive layer is negative working, such when the photosensitive layer comprises a photopolymerizable composition, the process typically also comprises a backflash exposure. Backflash exposure is a blanket exposure through the substrate, using radiation to which the photosensitive layer is sensitive. Backflash exposure creates a shallow layer of photopolymerized material, or a floor, on the substrate side of the photosensitive layer. The floor improves adhesion between the photosensitive layer and the support and also establishes the depth of the relief image in the resulting flexographic printing plate. Backflash exposure may be carried out before, during, or after the other imaging steps. Preferably, it is carried out after imaging of the masking layer and just prior to overall exposure. Any of the conventional radiation sources discussed above can be used for the backflash exposure step. Exposure time generally ranges from a few seconds up to about a minute.

Following overall exposure through the mask, and optionally backflashing, the masking layer is removed. Typically it is merely peeled away, but alternatively it may be removed as part of the developing step. In either case, the element is then developed by washing with a suitable developer. Development is usually carried out at about room temperature, and converts the latent image to an image by removing the unpolymerized regions of the photosensitive layer.

The developers can be organic solvents, aqueous or semi-aqueous solutions, and water. The choice of the developer will depend primarily on the chemical nature of the photopolymerizable layer. Suitable organic solvent developers include aromatic or aliphatic hydrocarbon and aliphatic or aromatic halohydrocarbon solvents, or mixtures of such solvents with suitable alcohols. Other organic solvent developers have been disclosed in Schober, U.S. Pat. No. 5,354,645. Suitable semi-aqueous developers usually contain water and a water miscible organic solvent and an alkaline material. Suitable aqueous developers usually contain water and an alkaline material. Other suitable aqueous developer combinations are described in Briney, U.S. Pat. No. 3,796,602.

Development time can vary, but it is typically in the range of about 2 to 25 minutes. Developer can be applied in any convenient manner, including immersion, spraying and brush or roller application. Brushing aids can be used to remove the unpolymerized portions of the photosensitive layer. However, washout is frequently carried out in an automatic processing unit, which uses developer and mechanical brushing action to remove the unexposed portions of the photosensitive layer, leaving a relief constituting the exposed image and the floor formed by the backside flask exposure.

Alternatively, when the photosensitive layer is not part of the imageable element, the element consisting of the masking layer on the substrate is imaged and developed as described above to form a photomask. The photomask is them placed on an imageable element comprising the photosensitive layer, a substrate, and, optionally, a barrier layer. The photosensitive imaged through the photomask as described above, the photomask removed, and the imaged photosensitive layer developed as described above. Imaging is conveniently carried out in a vacuum frame to ensure good contact between the mask and the imageable element.

Following development, the resulting flexographic printing plates are typically blotted or wiped dry, and then dried in a forced air or infrared oven. Drying times and temperatures may vary, however, typically the plate is dried for 60 to 120 minutes at 60° C. High temperatures are not recommended because the support can shrink, which may cause registration problems.

Flexographic printing plates are typically overall post-exposed to ensure that the photopolymerization process is complete and that the plate will remain stable during printing and storage. This post-exposure may be carried out with the same radiation source as was used for overall exposure.

Detackification is an optional post-development treatment that can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher, U.S. Pat. No. 4,400,459; Fickes, U.S. Pat. No. 4,400,460; and Herrmann, U.S. Pat. No. 4,906,551. Detackification can also be accomplished by exposure to radiation sources having a wavelength not longer than 300 nm, as disclosed in Gibson U.S. Pat. No. 4,806,506.

INDUSTRIAL APPLICABILITY

The imageable element can be used in the preparation of flexographic printing plates that can be used under white light conditions; they do not require the use of a safelight. Use of imageable elements comprising masking layers allows digital imaging of the plates using readily available thermal lasers, followed by exposure of the photosensitive layer with readily available high-power ultraviolet exposure equipment. This approach circumvents use of an ultraviolet laser to image the photosensitive layer, a method that is difficult by the lack of commercially available, economical and reliable ultraviolet lasers. Optionally, if a heated body is used for imaging, infrared absorber is not required at all, further reducing material costs.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

GLOSSARY

| | |
|---|---|
| BONJET ® CW-1 | Carbon black suspension, 20% in water (Orient Corporation, Seaford, Delaware, USA) |
| Capricorn ™ Gold | Positive working lithographic printing plate precursor (Kodak Polychrome Graphics, Norwalk, CT, USA) |
| Copolymer A | Terpolymer of methyl methacrylate, acrylonitrile, methacrylamide, and $CH_2=C(CH_3)(CO)O(CH_2)_2ONH(CO)NH-p-C_6H_4OH$; 10:40:10:40 (Kokusan Chemical, Tokyo, Japan) |
| CREO ® Trendsetter 3230 | Commercially available platesetter, using Procom Plus software, operating at a wavelength of 830 nm (Creo Products Inc., of Burnaby, BC, Canada) |
| DMF | N,N-Dimethylformamide |
| FC430 | Fluorad FC430, a 98.5% active fluoro-aliphatic ester surfactant (3M, St. Paul, MN, USA) |
| FXGE 003 | Carbon suspended in ethanol, 15% by weight (Nippon Shokubai, Otabi-cho, Suita, Osaka, Japan) |
| Goldstar ™ Developer | Sodium metasilicate developer (Kodak Polychrome Graphics, Norwalk, CT, USA) |
| IR Dye A | Infrared absorber (see structure below) (Eastman Kodak, Rochester, NY, USA) |
| LB-6564 | Phenol/cresol novolac resin (Bakelite AG, Southampton, UK) |
| LODYNE ® 103A | Fluorosurfactant (Ciba Specialty Chemicals, Tarrytown, New York, USA) |
| Pyridine - $SO_3$ complex | Sulfating agent (Aldrich, Milwaukee, WI, USA) |
| Sulfated Polymer A | Sulfated co-polymer (see Example 1) |
| Sulfated Polymer B | Sulfated novolac resin (see Example 2) |
| THF | Tetrahydrofuran |
| UVSOB 340 | 2-Hydroxy-4-Methoxybenzophenone-5-Sulfonic Acid (Benzophenone-4) (LC United Chemical, Taoyuan, Taiwan) |

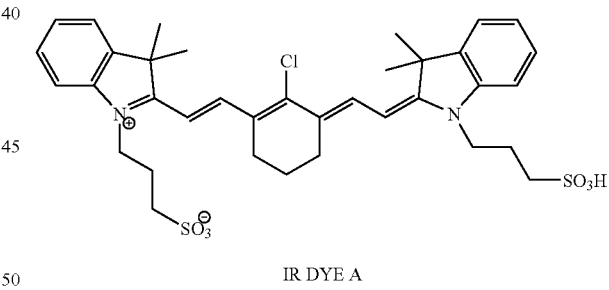

IR DYE A

General Procedures for the Preparation of Sulfated Polymers

1. Preparation of Sulfated Polymers that Contain the Ammonium Ion 5.0–10.0-g of precursor polymer, 2.0–8.0 g of pyridine-$SO_3$ complex, and 25–100 g of pyridine is added to a 250 ml flask equipped with magnetic stirring bar, and the reaction mixture stirred at room temperature for 18 hr. The solvent is decanted from the reaction mixture, and the viscous residue is stirred with 2–10 ml of 30% aqueous ammonium hydroxide for 30 min. The polymer is precipitated in 600–1,000 ml of 2-propanol, THF, acetone, or diethylether and filtered off. The resulting polymer is dissolved in 20–100 g of water, and the solution stored for further use.

2. Preparation of Sulfated Polymers that Contain the Pyridinium Ion 5.0–10.0-g of precursor polymer, 2.0–8.0 g of pyridine-SO$_3$ complex, and 25– 100 g of pyridine is added to a 250 ml flask equipped with magnetic stirring bar, and the reaction mixture stirred at room temperature for 18 hr. The solvent is decanted from the reaction mixture, and the viscous residue is precipitated in 600–1,000 ml of 2-propanol, THF, acetone, or diethylether and filtered off. The resulting polymer is dissolved in 20–100 g of water or water/alcohol, and the solution stored for further use.

3. Preparation of Sulfated Polymers that Contain the Tetramethylammonium Ion

In a 250 ml flask equipped with magnetic stirring bar, 5.0–10.0 g of precursor polymer, 2.0–8.0 g of pyridine-SO$_3$ complex, and 25–100 g of pyridine is added, and the mixture is stirred at room temperature for 18 hr. The solvent is decanted from the reaction mixture, and the product stirred with 2–10 ml of 25% tetramethylammonium hydroxide for 30 minutes. The reaction mixture is then precipitated in 600–1,000 ml of 2-propanol or THF, and the resulting polymer is then dissolved in 20–100 g of water or water/alcohol for further use.

Alternatively, sulfamic acid may be used as the sulfating agent for these polymers.

4. Preparation of Sulfated Polymers that Contain the Sodium Ion

In a 250 ml flask equipped with magnetic stirring bar, 5.0–10.0 g of precursor polymer, 2.0–8.0 g of pyridine-SO$_3$ complex, and 25–100 g of pyridine is added, and the mixture is stirred at room temperature for 18 hr. After the solvent is decanted, the polymer is stirred with 10–20 ml of 10% sodium hydroxide for 30 min. The reaction mixture is then precipitated in 600–1,000 ml of 2-propanol or THF, and the resulting polymer is then dissolved in 20–100 g of water or water/alcohol for further use.

Example 1

This Example illustrates the preparation of Sulfated Polymer A. The precursor polymer, Copolymer A, was sulfated to Sulfated Polymer A following the general procedure for the preparation of sulfated polymers that contain the tetramethylammonium ion given in the General Procedures. Degree of sulfation: about 100%.

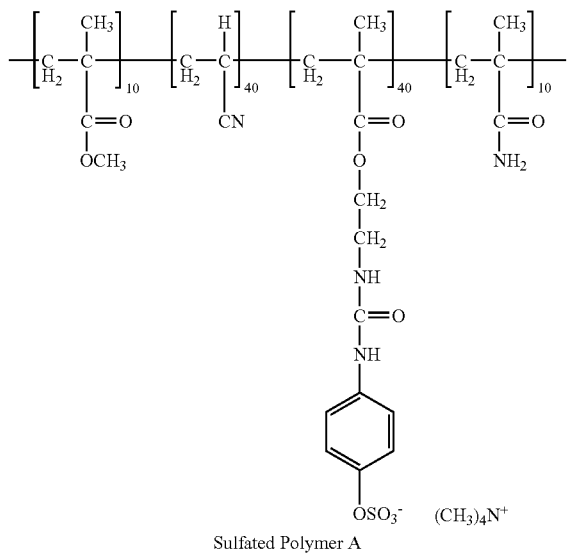

Sulfated Polymer A

Example 2

This Example illustrates the preparation of Sulfated Polymer B.

50.0 g of pyridine-SO$_3$ complex was added into a solution containing 36.0 g of LB-6564 and 120 g of DMF. The resulting solution was stirred at room temperature for about 20 hr. 60 ml of 28% aqueous ammonium hydroxide solution was added and the mixture was stirred for another 2 hr. Then 135 ml of methanol was added, and the mixture stirred for an additional 2 hr.

The resulting cloudy suspension was filtered. The sulfated phenolic resin was precipitated by addition of 1.5 L of acetone to the filtrate with stirring. After the acetone was decanted, the precipitate was dried in a stream of nitrogen. Degree of sulfation: about 100%.

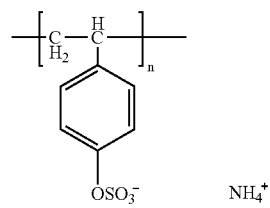

Sulfated Poymer B n = 900 to 1000

Example 3

The ingredients listed in the table below were dissolved in water:1-propanol (80:20, w:w) and coated onto unsubbed polyester film using a wire wound bar. The concentration was selected to provide masking layers having coating weights of 2.5 g/m$^2$ and 5.0 g/m$^2$. The resulting imageable elements were dried at 100° C. for 60 sec.

| Component | Parts by Weight |
| --- | --- |
| Polymer B | 54.0 |
| BONJET ® CW-1 | 30.0 |
| IR Dye A | 15.0 |
| FC430 | 1.0 |

The imageable elements were imaged on a CREO® Trendsetter, using an internal test pattern (plot 0) at 100, 200, 300, 400 and 500 mJ/cm$^2$. The resulting imaged imageable elements were developed using plain tap water as follows:

a) wetted with a moderate stream of 18° C. tap water for 5 sec, b) wiped gently for 10 sec with a cotton pad, c) picked up, rinsed for 1 to 2 sec with tap water, and d) allowed to air dry.

The D$_{max}$ of the resulting imaged and developed masks was 2.0 for the 2.5 g/m$^2$ coating weight layer and 4.5 for the 5.0 g/m$^2$ coating weight layer. For each coating weight, the D$_{min}$ (optical density of the unimaged regions removed by development) was 0.01. Optical density was measured using white light.

The optimum exposure energy at 300 mJ/cm$^2$ for the 2.5 g/m$^2$ coating weight and 500 mJ/cm$^2$ for the 5.0 g/m$^2$ coating weight. Masks prepared at optimum imaging energies were used in the conventional imaging of Capricorn™ Gold printing plate precursors. The precursors, size 460×660×0.3 mm, were imaged in a lightframe (OLIX A1 131+light integrator, OLEC, Irvine, Calif., USA), developed by hand with Goldstar™ developer for 10 sec, rinsed with water and air-dried. The results are shown below.

| Mask coating weight (g/m²) | Area of plot 0 image | UV exposure (min)[a] | Comment |
|---|---|---|---|
| 2.5 | Fine lines & dots | <10 | An UGRA target wedge, used as a reference appeared to perform as the 5.0 g/m² mask |
| 5.0 | Fine lines & dots | 10 | |
| 2.5 | Solid Image | 10 | |
| 5.0 | Solid Image | >30 | |

[a]Minutes the indicated regions of the mask prevented imaging of the underlying photosensitive layer.

Example 4

The coversheet and release layer are removed from a CYREL® flexographic printing plate precursor, type 67HLS, leaving the photosensitive layer as the top layer, overlying a substrate.

The coating solution from Example 3 is applied onto the photosensitive layer using a wire wound Meyer bar and dried at 100° C. for 60 sec in a Mathis oven. The coating weight of the resulting masking layer is 5.0 g/m².

The resulting imageable element is imaged on a CREO® Trendsetter at 500 mJ/cm², using an internal test pattern and is developed as described in Example 2. In the imaged regions of the masking layer, the imageable layer resists water development. The unimaged regions are removed.

The resulting element is given a back flash exposure of 14 sec using a CYREL® 3040 light source, and is then exposed for 2 min without a vacuum through the imaged and developed masking layer. The exposed element is then developed in a CYREL® rotary processor for 6 min using a 3:1 mixture (vol/vol) of perclene and butanol. The masking layer and the unexposed regions of the photosensitive layer are removed to form a relief printing plate. The printing plate is oven dried for 1 hr at 60° C. and is then simultaneously post exposed and finished in a CYREL® light finishing unit for 5 min. On printing with the plate, good images are obtained.

Example 5

The ingredients listed in the Table were dissolved in water:ethanol (55:45, w:w) and coated onto unsubbed polyester film using a wire wound bar. The concentration was selected to provide masking layers having coating weights of 2.5 g/m² and 5.0 g/m². The resulting imageable elements were dried at 100° C. for 60 sec.

| Component | Parts by Weight |
|---|---|
| Sulfated Polymer A | 54.0 |
| FXGE 003 | 30.0 |
| IR Dye A | 15.0 |
| FC430 | 1.0 |

The resulting imageable elements imaged on the CREO® Trendsetter, using an internal test pattern (plot 0), at 400 mJ/cm² for the 5.0 g/m² coating weight and 300 mJ/cm² for the 2.5 g/m² coating weight and developed as in Example 3. The $D_{max}$ of the resulting imaged and developed masking layer was 4.0 for the 5.0 g/m² masking layer and 2.0 for the 2.5 g/m² masking layer. For each coating weight, the $D_{min}$ was 0.01.

Example 6

An imageable element in which the masking layer had a coating weight of 5.0 g/m² was prepared as in Example 3, except that Sulfated Polymer B was used in place of Sulfated Polymer A. The imageable element was imaged on the CREO® Trendsetter using an internal test pattern (plot 0) at 300 mJ/cm² and developed as in Example 3. The $D_{max}$ of the resulting imaged and developed mask was 3.5. The $D_{min}$ was 0.01.

Example 7

An imageable element in which the masking layer had a coating weight of 5.0 g/m² was prepared as in Example 3, except the composition given in the table below was dissolved in water:1-propanol (80:20, w:w), was used. The imageable element was imaged on the CREO® Trendsetter using an internal test pattern (plot 0) at 500 mJ/cm² and developed as in Example 3. The $D_{max}$ of the resulting imaged and developed mask was 4.5. The $D_{min}$ was 0.01.

| Component | Parts by Weight |
|---|---|
| Sulfated Polymer A | 54.9 |
| BONJET® CW-1 | 30.0 |
| IR Dye A | 15.0 |
| LONDYNE® 103A | 0.1 |

Example 8

An imageable element in which the masking layer had a coating weight of 5.0 g/m² was prepared as in Example 3, except the composition given in the table below, dissolved in water:1-propanol (80:20, w:w), was used. The imageable element was imaged on the CREO® Trendsetter using an internal test pattern (plot 0) at 500 mJ/cm² and developed as in Example 3. The $D_{max}$ of the resulting imaged and developed mask was 4.5. The $D_{min}$ was 0.01.

| Component | Parts by Weight |
|---|---|
| Sulfated Polymer A | 52.0 |
| BONJET® CW-1 | 30.0 |
| IR dye A | 15.0 |
| FC430 | 1.0 |
| UVSOB 340 | 2.0 |

The resulting mask in the conventional imaging of a Capricorn™ Gold printing plate precursor. The precursors are imaged and developed as in Example 3. The results are shown below.

| Mask coating weight (g/m²) | Area of plot 0 image | UV exposure (min)[a] | Comment |
|---|---|---|---|
| 5.0 | Fine lines and dots | 10 | Visually, a slight improvement over Example 3 |
| 5.0 | Solid Image | >30 | |

[a] Minutes the indicated regions of the mask prevented imaging of the underlying photosensitive layer.

Having described the invention, we now claim the following and their equivalents.

What is claimed is:

1. An imageable element comprising, in order:
   (a) a substrate,
   (b) a photosensitive layer comprising a photosensitive composition, and
   (c) a masking layer comprising a sulfated polymer and a radiation absorber over the photosensitive layer;
   in which:
   the radiation absorber comprises one or more materials selected from the group consisting of materials that absorb ultraviolet radiation, photothermal conversion materials, photothermal conversion materials that also absorb ultraviolet radiation, and mixtures thereof; and the masking layer absorbs ultraviolet radiation and infrared radiation.

2. The element of claim 1 in which the radiation absorber comprises carbon black.

3. The element of claim 1 in which the sulfate groups are attached to aryl groups.

4. The element of claim 3 in which the sulfated polymer is a sulfated novolac resin.

5. The element of claim 1 in which the sulfate groups are attached to alkyl groups.

6. The element of claim 5 in which the sulfated polymer is:
   1) a sulfated co-polymer of methyl methacrylate, acrylonitrile, methacrylamide, and CH2=C(CH3)—CO2—(CH2)2—NH—CO—NH-p-C6H4—OH;
   2) a sulfated co-polymer of acrylonitrile, methacrylamide, N-phenylmaleimide, CH2=C(CH3)—CO—NH-p-C6H4—CO2H, and —CH2=C(CH3)—CO2—(CH2)2—NH—CO—NH-p-C6H4—OH;
   3) a sulfated co-polymer of butyl methacrylate, styrene, hydroxyethyl methacrylate, and methacrylic acid,
   4) a mixture thereof.

7. The element of claim 1 in which the sulfated polymer comprises hydroxyl groups and the sulfate groups, and at least 50% of the sum of the hydroxyl groups and the sulfate groups are sulfate groups.

8. The element of claim 7 in which the radiation absorber comprises carbon black, and the sulfated polymer comprises a sulfated phenolic resin.

9. The element of claim 7 in which the radiation absorber comprises carbon black, and the sulfate groups are attached to alkyl groups.

10. The element of claim 1 in which the substrate is a flexible substrate.

11. The element of claim 1 in which the photosensitive layer comprises a negative working photosensitive composition.

12. The element of claim 11 in which the negative working photosensitive composition is a photopolymerizable composition.

13. The element of claim 12 in which the photosensitive layer is at least 20 0.25 cm thick.

14. The element of claim 12 in which the sulfate groups are attached to aryl groups.

15. The element of claim 14 in which the sulfated polymer is a sulfated novolac resin.

16. The element of claim 12 in which the sulfate groups are attached to alkyl groups.

17. The element of claim 12 in which the sulfated polymer comprises hydroxyl groups and the sulfate groups, and at least 50% of the sum of the hydroxyl groups and the sulfate groups are sulfate groups.

18. The element of claim 12 in which the radiation absorber comprises carbon black.

19. The element of claim 12 in which the imageable element additionally comprises a barrier layer between the photosensitive layer and the masking layer.

20. The element of claim 19 in which the sulfated polymer comprises a sulfated phenolic resin, and the sulfated phenolic resin has a degree of sulfation of 0.5 or greater.

21. The element of claim 20 in which the radiation absorber comprises carbon black.

22. A method for forming an image, the method comprising the steps of:
   (A) providing an imageable element, the imageable element comprising, in order:
      (i) a flexible substrate,
      (ii) a photosensitive layer, and
      (iii) a masking layer comprising a sulfated polymer and a radiation absorber;
   in which,
   the radiation absorber comprises one or more materials selected from the group consisting of materials that absorb ultraviolet radiation, photothermal conversion materials, photothermal conversion materials that also absorb ultraviolet radiation, and mixtures thereof; and the masking layer absorbs ultraviolet radiation and infrared radiation;
   (B) thermally imaging the masking layer and forming an imaged masking layer comprising imaged regions and complementary unimaged regions in the imageable layer;
   (C) forming a photomask by developing the imaged masking layer and removing the unimaged regions;
   (D) overall exposing the imageable element with ultraviolet radiation through the photomask and forming an imaged imageable element comprising imaged and complementary unimaged regions in the photosensitive layer;
   (E) removing the photomask; and
   (F) developing the imaged imageable element and forming the image by removing one of the imaged regions and the unimaged regions.

23. The method of claim 22 in which steps (E) and (F) are carried out at the same time.

24. The method of claim 22 in which the photosensitive layer is at least 0.25 cm thick; the imageable element additionally comprises a barrier layer between the photosensitive layer and the masking layer; the photosensitive layer comprises a photopolymerizable composition; and the developing removes the unimaged regions.

25. The method of claim 24 in which the radiation absorber comprises carbon black.

26. The method of claim 24 in which the sulfate groups are attached to aryl groups.

27. The method of claim 26 in which the sulfated polymer is a sulfated novolac resin.

28. The method of claim 24 in which the sulfate groups are attached to alkyl groups.

29. The method of claim 24 in which the sulfated polymer comprises hydroxyl groups and the sulfate groups, and at least 50% of the sum of the hydroxyl groups and the sulfate groups are sulfate groups.

30. The method of claim 29 in which the radiation absorber comprises carbon black, and the sulfated polymer comprises a sulfated phenolic resin.

31. The method of claim 24 in which the substrate transmits ultraviolet radiation and the method additionally comprises a backflash exposure.

32. A method for forming an image, the method comprising the steps of:
  (A) providing a first imageable element, the first imageable element comprising, in order:
  a first substrate, and
  a masking layer comprising a sulfated polymer and a radiation absorber on the first substrate;
  in which:
  the radiation absorber comprises one or more materials selected from the group consisting of materials that absorb ultraviolet radiation, photothermal conversion materials, photothermal conversion materials that also absorb ultraviolet radiation, and mixtures thereof;
  the first substrate transmits ultraviolet radiation; and
  the masking layer absorbs ultraviolet radiation and infrared radiation;
  (B) thermally imaging the masking layer and forming an imaged masking layer comprising imaged regions and complementary unimaged regions;
  (C) forming a photomask by developing the imaged masking layer and removing the unimaged regions;
  (D) providing a second imageable element, the second imageable element comprising, in order:
  a second substrate; and
  a photosensitive layer over the second substrate;
  (E) overall exposing the photosensitive layer with ultraviolet radiation through the photomask and forming an imaged second imageable element in which the photosensitive layer comprises imaged and complementary unimaged regions;
  (F) removing the photomask; and
  (G) developing the imaged second imageable element and forming the image by removing one of the imaged regions and the unimaged regions.

33. The method of claim 32 in which the photosensitive layer is at least 0.25 cm thick; the photosensitive layer comprises a photopolymerizable composition; and the developing removes the unimaged regions.

34. The method of claim 33 in which the sulfated polymer comprises hydroxyl groups and the sulfate groups, and at least 50% of the sum of the hydroxyl groups and the sulfate groups are sulfate groups.

* * * * *